(12) United States Patent
Konishi et al.

(10) Patent No.: US 6,431,258 B1
(45) Date of Patent: Aug. 13, 2002

(54) PROCESS SOLUTION SUPPLYING APPARATUS

(75) Inventors: Nobuo Konishi, Yamanashi-ken; Keizo Hirose, Kofu, both of (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/708,631

(22) Filed: Nov. 9, 2000

Related U.S. Application Data

(62) Division of application No. 09/105,166, filed on Jun. 26, 1998, now Pat. No. 6,165,270.

(30) Foreign Application Priority Data

| Jul. 4, 1997 | (JP) | 9-193374 |
| Jul. 4, 1997 | (JP) | 9-193377 |
| Jul. 4, 1997 | (JP) | 9-193378 |

(51) Int. Cl.$^7$ ............................... F28F 7/00
(52) U.S. Cl. .................. 165/46; 165/154; 138/38
(58) Field of Search .............. 165/46, 155, 154; 29/890.036; 138/38

(56) References Cited

U.S. PATENT DOCUMENTS

| 3,438,430 A | * | 4/1969 | Kestemont | 165/154 |
| 3,545,230 A | * | 12/1970 | Morse | 165/46 |
| 4,893,670 A | * | 1/1990 | Joshi et al. | 165/46 |

FOREIGN PATENT DOCUMENTS

| JP | 63-236559 | 10/1988 |
| JP | 4-115520 | 4/1992 |
| JP | 4-265145 | 9/1992 |
| JP | 6-236843 | 8/1994 |
| JP | 07-153671 | 6/1995 |
| JP | 07-283184 | 10/1995 |
| JP | 2759152 | 3/1998 |

* cited by examiner

Primary Examiner—Henry Bennett
Assistant Examiner—Terrell McKinnon
(74) Attorney, Agent, or Firm—Oblon, Spivak, McClelland, Maier & Neustadt, P.C.

(57) ABSTRACT

A process solution supplying mechanism for supplying a process solution to a wafer, comprises a source for containing the process solution, a pipe for introducing the process solution from the source to the wafer, a process solution supply driving system for supplying the process solution from the source to the wafer, and a process solution supplying/stopping mechanism for carrying out apply and stop of the process solution, wherein the pipe and the process solution supply driving system are provided separately and the process solution supplying/stopping mechanism is provided to a portion other than the pipe.

6 Claims, 5 Drawing Sheets

PROCESS SOLUTION SUPPLYING APPARATUS

This application is a divisional application of U.S. patent application Ser. No. 09/105,166, filed on Jun. 26, 1998, which is now U.S. Pat. No. 6,165,27.

BACKGROUND OF THE INVENTION

1. Field of the Invention

The present invention relates to a process solution supplying mechanism for supplying a process solution such as a resist solution, a developing solution, etc. to an object to be processed such as a semiconductor wafer, an LCD substrate, etc., for example, and a liquid discharging device.

2. Discussion of the Background

In the fabrication of the semiconductor device and the liquid crystal display device, circuit patterns are formed by a so-called photolithography technique in which photoresist is coated on the semiconductor wafer or the LCD substrate as a object to be processed, then exposed to correspond to the circuit patterns, and then developed.

In such a coating/developing process, the resist solution, the developing solution, etc. are used as the process solution. In the existing circumstances, these liquids are supplied to the object to be processed from a process solution tank via pipes by virtue of a pump. For this reason, valves for controlling a discharge of the process solution, for example, an air operation valve, a suck-back valve, etc. in addition to the pump are inserted in these pipes, and also joints required to fit the valves are inserted in these pipes. Also, in the event that such a process solution is contained in a vessel such as a gallon bottle and then is gas-supplied by supplying directly a pressure gas into the vessel, the process solution must be filtered by a filter. Hence, in the prior art, the filter is fitted to the pipes. In this case, two joints are also needed to fit the filter to the pipes.

Meanwhile, in such coating/developing processes, a gasified liquid HMDS as well as the process solution such as the above resist solution, the developing solution, etc. is employed in a adhesion process.

From a viewpoint of safety of the process, etc., these process solutions and the gas are temperature-controlled by using a heat exchanger when they are transferred via the pipes. As the heat exchanger, for example, such a heat exchanger is employed that a temperature regulating water is circulated around the passage while flowing the chemicals and the gas through the internal honeycomb passage. Normally, the heat exchanger is fitted by two joints in the middle of the pipes.

However, if these valves, joints, etc. are inserted in the pipes, change in the pressure of the solution is caused because of orifices formed by joints, etc., so that fine vapors are generated in the process solution correspondingly. If especially a photoresist to be exposed i-ray, etc. which is used to correspond to the request of miniaturization of the device is employed, such fine vapors are largely affected. Hence, there is a possibility that high precision wiring patterns cannot be formed because of the presence of such fine vapors.

In addition, because of the presence of the valve and the joints in the pipes, stagnation of the process solution occurs in the pipes and then change in components of the process solution is caused after a long time has elapsed. As a result, sometimes the deteriorated process solution is discharged from the pipes. For instance, in the case of the resist solution, photosensitive material is destroyed due to a long time stagnation to thus lower the function of the resist.

BRIEF SUMMARY OF THE INVENTION

It is an object of the present invention to provide a process solution supplying apparatus and a liquid discharging device, which are capable of preventing generation of fine vapor in the solution passing through pipes and generation of degradation of the solution.

It is another object of the present invention to provide a process solution supplying apparatus which is capable of filtering the process solution without providing a joint in the middle of the pipes.

It is still another object of the present invention to provide a temperature adjusting device which is capable of fitting the pipes without the intervention of the joint and adjusting effectively a temperature of the fluid passing through the pipes.

According to a first aspect of the present invention, there is provided a process solution supplying apparatus for supplying a process solution to a substrate to be processed, comprising:

a process solution source for containing the process solution;

a pipe for introducing the process solution from the process solution source to the substrate;

a process solution supply driving system for supplying the process solution from the process solution source to the pipe; and a process solution supplying/stopping mechanism for carrying out supply and stop of the process solution;

wherein the pipe and the process solution supply driving system are provided separately, and the process solution supplying/stopping mechanism is provided to a portion other than the process solution pipe.

According to a second aspect of the present invention, there is provided a process solution supplying apparatus for supplying a process solution to a substrate to be processed, comprising:

a process solution source for containing the process solution;

a first pipe for introducing the process solution from the process solution source to the substrate to be processed;

a pressure applying gas source for supplying a gas to apply the pressure to the process solution contained in the process solution source;

a second pipe for introducing the gas in the pressure applying gas source to the process solution source; and a gas pressure stopping valve provided in the second pipe, for carrying out apply and stop of the gas pressure;

wherein the first pipe and the second pipe are provided separately, the process solution can be supplied to the substrate to be processed via the first pipe by applying the pressure to the process solution contained in the process solution source from the pressure applying gas source via the second pipe in a situation that the gas pressure applying/stopping valve is opened, and supply of the process solution can be stopped by closing the gas pressure applying/stopping valve.

According to a third aspect of the present invention, there is provided a liquid discharging device comprising:

a liquid source for containing a liquid which is applied to an object to be processed;

a liquid discharging pipe communicated with the liquid source, having a nozzle for discharging the liquid;

a liquid discharge driving system for providing a driving force to the liquid so as to discharge the liquid from the nozzle; and a liquid discharging/stopping mechanism for carrying out discharge and stop of the liquid;

wherein the liquid discharging pipe and the liquid discharge driving system are provided separately, and the liquid discharging/stopping mechanism is provided to a portion other than the liquid discharging pipe.

According to a fourth aspect of the present invention, there is provided a process solution supplying apparatus comprising:

a process solution containing vessel for containing a process solution;

a pipe for supplying the process solution from the process solution containing vessel;

a process solution supply driving system for applying a driving force to supply the process solution from the process solution containing vessel via the pipe; and;

a filter provided in the process solution containing vessel, for filtering the process solution.

According to a fifth aspect of the present invention, there is provided a liquid discharging device comprising:

a liquid containing vessel for containing a liquid which is applied an object to be processed;

a pipe for supplying the liquid from the liquid containing vessel;

a liquid discharge driving system for applying a driving force to discharge the liquid from the liquid containing vessel via the pipe; and a filter provided in the liquid containing vessel, for filtering the liquid.

According to a sixth aspect of the present invention, there is provided a temperature adjusting device for adjusting a temperature of a process fluid passing through a pipe, comprising:

cylindrical main bodies provided around the pipe at a distance;

a film-like member having flexibility and heat conductivity, and arranged between the cylindrical main bodies and the pipe and also arranged so as to cover a circumference of the pipe;

fitting members for fitting the film-like member to both ends of the main body in a liquid sealing condition; and a heat exchange medium supplying means for supplying a medium into spaces between the cylindrical main bodies and the film-like member, said medium to heat exchange the process fluid in the pipe.

According to a seventh aspect of the present invention, there is provided a fluid supplying device comprising:

a fluid supplying source for supplying a process fluid;

a pipe for supplying the fluid from the process fluid supplying source;

a fluid supply driving system for applying a driving force to supply the process fluid from the fluid supplying source via the pipe; and a temperature adjusting mechanism provided in the pipe, for adjusting a temperature of the process fluid passing through the pipe;

wherein the temperature adjusting mechanism includes, cylindrical main bodies provided around the pipe at a distance, a film-like member having flexibility and heat conductivity, and arranged between the cylindrical main bodies and the pipe and also arranged so as to cover the pipe, fitting members for fitting the film-like member to both ends of the main body in a liquid sealing condition, and a heat exchange medium supplying means for supplying a medium into spaces between the cylindrical main bodies and the film-like member, said medium to heat exchange the process fluid in the pipe.

According to the above first and third aspects of the present invention, the process solution supplying/stopping mechanism or the liquid discharging/stopping mechanism, which has been provided in the pipe through which the process solution is passed in the prior art, is provided to a portion other than the pipe. Therefore, the valve and the joints for fitting the valve can be omitted in the pipe and thus generation of the orifices and the stagnation in the pipe can be avoided. As a result, generation of fine vapors in the process solution passing through the pipe and also generation of degradation of the process solution can be prevented.

According to the above second aspect of the present invention, the first pipe and the second pipe are provided separately, and the process solution can be supplied to the substrate to be processed via the first pipe by applying the pressure to the process solution contained in the process solution source from the pressure applying gas source via the pressure applying pipe in a situation that the gas pressure applying/stopping valve is opened, and supply of the process solution can be stopped by closing the gas pressure applying/stopping valve. Therefore, the valves and the joints for fitting such valves are not needed in the first pipe and therefore generation of the orifices and stagnation portions can be avoided in the first pipe. As a consequence, generation of fine vapors in the process solution passing through the first pipe and also generation of degradation of the process solution can be prevented.

According to the above fourth and fifth aspects of the present invention, since the filter for filtering the liquid is provided in the liquid containing vessel, the filter to be fitted in the middle of the liquid supplying pipe is not needed. Hence, it is possible to filter the liquid without provision of the joints in the liquid supplying pipes.

According to the above sixth and seventh aspects of the present invention, cylindrical main bodies are provided around the pipe at a distance, then a film-like member having flexibility and heat conductivity is arranged between the cylindrical main bodies and the pipe so as to cover the pipe, then the film-like member is fitted to both ends of the main body by the fitting members, and then a temperature adjusting liquid is supplied into spaces between the cylindrical main bodies and the film-like member. Therefore, when the temperature adjusted liquid is supplied, the film-like member is caused to be brought into tight contact with the outside of the pipe owing to its pressure of the liquid to thus enable heat exchange between the film-like member and the fluid passing through the pipes. Accordingly, regardless of fitting of the joints to the pipes, the temperature of the fluid passing through the pipes can be effectively controlled.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

DETAILED DESCRIPTION OF THE INVENTION

Embodiments of the present invention will be explained in detail with reference to the accompanying drawings hereinafter.

Figure 1:
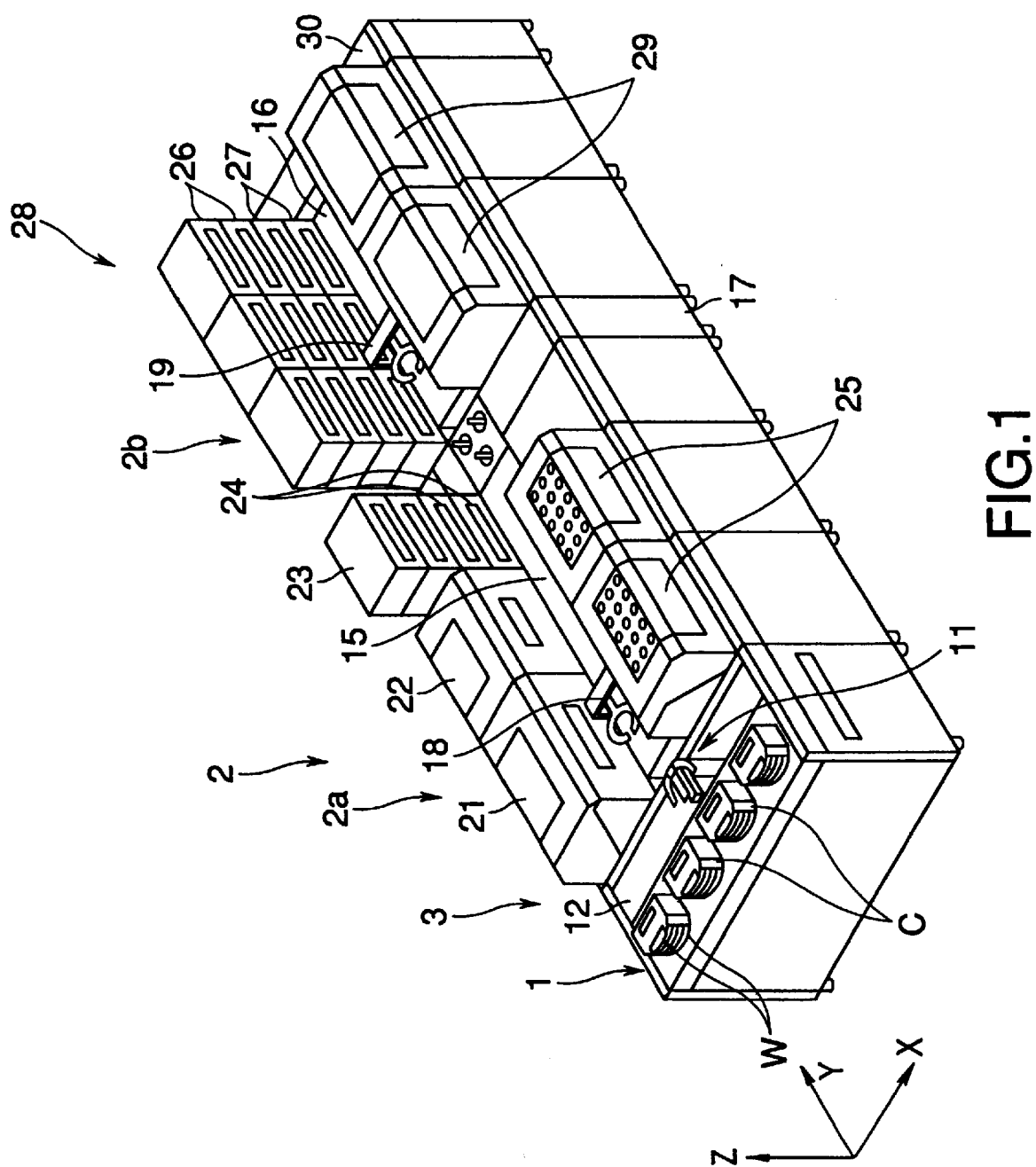
FIG. 1 is a perspective view showing a resist coating/ developing system to which a process solution supplying apparatus as a substrate of the present invention is applied.

FIG. 1 is a perspective view showing a coating/ developing process system for a semiconductor wafer, into which a coating apparatus as an object of the present invention is installed.

The coating/developing process system comprises a cassette station 1 on which a cassette C for holding a plurality of semiconductor wafers W therein is loaded, a processing section 2 equipped with a plurality of processing units for applying a series of processes including resist coating/ developing processes to the semiconductor wafer, and a carrying mechanism 3 for carrying the semiconductor wafer W between the cassette C placed on the cassette station 1 and the processing section 2. Loading/unloading of the cassette C into/from the system is carried out by the cassette station 1. The carrying mechanism 3 has a carrying arm 11 which can move on a carrying path 12 provided along the cassette alignment direction. The semiconductor wafer W can be carried between the cassette C and the processing section 2 by using the carrying arm 11.

The processing section 2 is divided into a preceding stage section 2a and a succeeding stage section 2b. Passages 15, 16 are provided in the middle of the preceding stage section 2a and the succeeding stage section 2b respectively. Respective processing units are arranged on both sides of these passages 15, 16. A relay portion 17 is provided between the preceding stage section 2a and the succeeding stage section 2b.

The preceding stage section 2a is equipped with a main arm 18 which is movable along the passage 15. A brush cleaning unit 21, a rinsing unit 22, an adhesion unit 23, and a cooling unit 24 are arranged on one side of the passage 15, while two resist coating units 25 as an object of the present invention are arranged on the other side of the passage 15.

Also, the succeeding stage section 2b is equipped with a main arm 19 which is movable along the passage 16. A group of thermal system units 28 consisting of plural heating units 26 and plural cooling process units 27 are arranged on one side of the passage 16, while two developing units 29 are arranged on the other side of the passage 16. As the group of thermal system units 28, three sets of four-step units are aligned along the passage 16 wherein two upper steps are the heating units 26 and two lower steps are the cooling units 27. The heating units 26 execute prebake to stabilize the resist, post exposure bake after the exposure has been completed, and post bake after the development has been completed. An interface section 30 which is used to transfer/receive the semiconductor wafer W between the succeeding stage section 2b and an exposure unit (not shown) is provided at the rear end of the succeeding stage section 2b.

The above main arm 18 has functions of transferring/ receiving the semiconductor wafer W to/from the carrying arm 11 of the carrying mechanism 3, and loading/unloading the wafer W into/from respective processing units in the preceding stage section 2a, and transferring/receiving the wafer W to/from the relay section 17. Similarly, the above main arm 19 has functions of transferring/receiving the semiconductor wafer W to/from the relay section 17, and loading/unloading the wafer W into/from respective processing units in the succeeding stage section 2b, and transferring/receiving the wafer W to/from the interface section 30.

Like the above, space saving and improvement in efficiency of the processes can be attained by collecting respective processing units integratedly. The overall processing section 2 including these processing units is housed in a casing (not shown).

In the coating/developing process system constructed as above, the wafer W in the cassette C is transferred to the processing section 2. First, the wafer W is subjected to the cleaning process by the cleaning unit 21 and the rinsing unit 22, then is subjected to the hydrophobic process by the adhesion unit 23 to enhance fixation of the resist, then is cooled by the cooling unit 24, and then is coated with the resist by the resist coating unit 25. Then, the wafer W is subjected to the prebake process by one of the heating units 26, then is cooled by the cooling units 27, then is carried to the exposure unit via the interface section 30. Predetermined patterns are exposed onto the wafer W by the exposure unit. Then, the wafer W is loaded into one of the heating units 26 via the interface section 30 again, and then the post exposure bake process is applied to the wafer W therein. Then, the wafer W is cooled by the cooling units 27 and then is subjected to the development process by the developing unit 29, so that predetermined circuit patterns are formed on the wafer W. The wafer W being subjected to the developing process is subjected to the post bake process by one of the heating units 26, then is cooled by the cooling unit 27, and then is accommodated into a predetermined cassette on the cassette station 1 by means of the main arms 18, 19 and the carrying mechanism 3.

Figure 2:
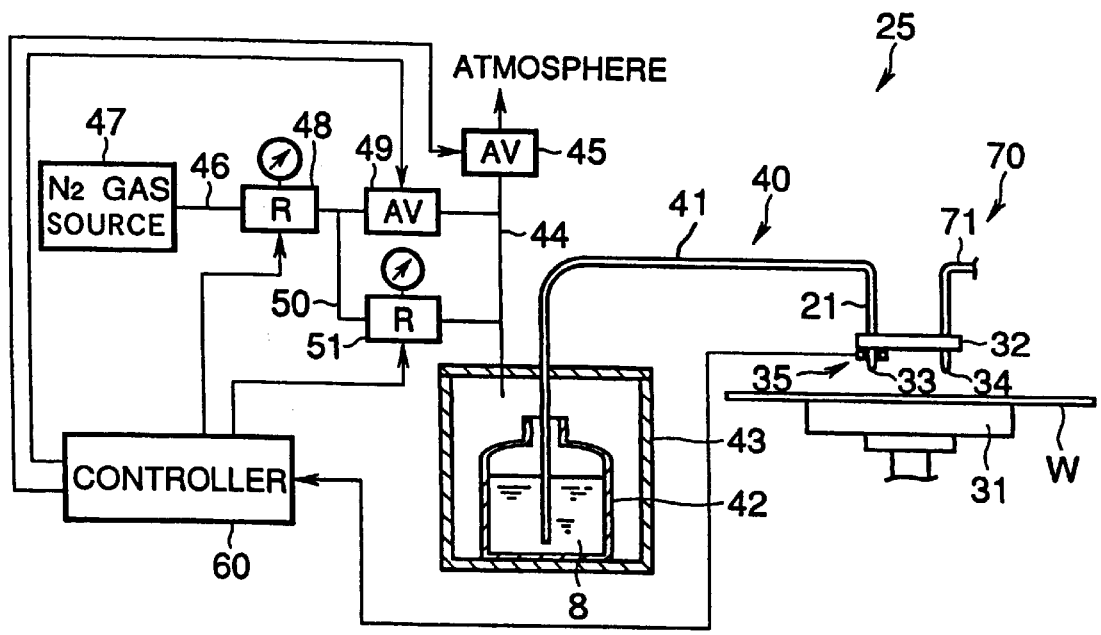
FIG. 2 is a view showing a resist solution/solvent supplying system in a resist coating unit into which a process solution supplying apparatus according to an embodiment of the present invention is incorporated.

Next, a resist coating unit 25 into which a process solution supplying mechanism as an object of the present invention is incorporated will be explained with reference to FIG. 2. As shown in FIG. 2, the resist coating unit 25 has a spin chuck 31 for holding the wafer W by vacuum suction. A nozzle holder 32 is provided over the spin chuck 31. A resist solution nozzle 33 and a solvent nozzle 34 are secured to the nozzle holder 32. The wafer W held by the spin chuck 31 is surrounded by a cup (not shown).

Figure 3:
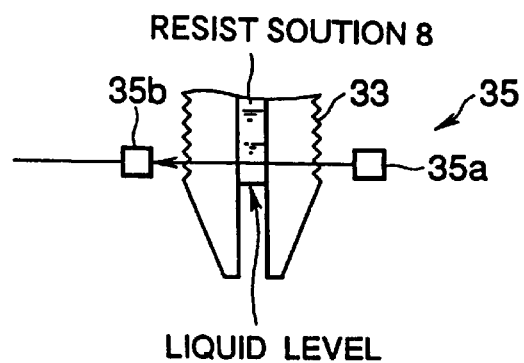
FIG. 3 is a view showing a state to detect a liquid level in a resist liquid nozzle.

A transmission sensor 35 for detecting a liquid level of resist solution 8 in the nozzle 33 is provided to the nozzle 33. As shown in FIG. 3, the transmission sensor 35 has a light emitting element 35a and a light receiving element 35b. The transmission sensor 35 can detect the presence of the resist solution 8 in the transmitted area based on quantity of light which is emitted from the light emitting element 35a, then transmitted through the nozzle 33, and then is incident into the light receiving element 35b to thus detect the liquid level in the nozzle 33.

A resist solution supplying mechanism 40 has a resist solution supply pipe 41. The nozzle 33 is provided to one end of the pipe 41 while the other end thereof is inserted into a resist solution container 42. A resist solution 8 is stored in the container 42 which is installed in a pressure vessel 43. Unlike the prior art, a pump, an air operation valve, a suck-back valve, a filter, etc. are not inserted in the pipe 41.

One end of a pipe 44 is connected to the pressure vessel 43 and the other end of the pipe 44 is opened to the outer air. An air operation valve 45 is provided to the pipe 44. A branch pipe 46 is connected to the pipe 44 between the air operation valve 45 and the pressure vessel 43. An N2 gas source 47 is provided to a top end of the pipe 46. A regulator 48 for regulating the pressure used for pressurization and an air operation valve 49 are inserted in the pipe 46. One end of a branch pipe 50 is connected to the pipe 46 between the regulator 48 and the air operation valve 49, and the other end of the pipe 50 is connected to the pipe 44 in the neighborhood of the pressure vessel 43. A regulator 51 is inserted in the pipe 50.

The air operation valves 45, 49 and the regulators 48, 51 are controlled by a controller 60. An output from the light receiving element 35b of the transmission sensor 35 is input into the controller 60. And, a gas pressure of the N2 gas source 47 is applied to an inside of the pressure vessel 43 by closing the air operation valve 45 and opening the air operation valves 49. The resist solution 8 is then supplied from the container 42 via the pipe 41 by virtue of the gas pressure, and then discharged from the nozzle 33. Then, after discharge of the resist liquid has been completed, the resist solution 8 remaining at the top end of the nozzle 33 can be suck-backed by opening the air operation valve 45 and closing the air operation valves 49. In addition, the liquid level in the nozzle 33 is stopped by closing both the air operation valves 45, 49.

In the meanwhile, a solvent supplying mechanism 70 has a solvent supplying pipe 71 and the above solvent nozzle 34 is provided to one end of the pipe 71. The solvent supplying mechanism 70, though its illustration is omitted, has the same configuration as the resist solution supplying mechanism 40 in principle.

Next, a resist solution supplying operation effected by the resist solution supplying mechanism 40 will be explained. In case the resist solution 8 is supplied to the wafer W by discharging the resist solution 8 from the nozzle 33, first the N2 gas is supplied into the pressure vessel 43 from the N2 gas source 47 via the pipes 46, 44 by closing the air operation valve 45 and opening the air operation valve 49. Then, the resist solution 8 in the container 42 is discharged from the nozzle 33 provided at the top end of the pipe 41 via the pipe 41 and thus supplied to the wafer W. In this case, the controller 60 can control and adjust the regulator 48 such that a pressure level can be set to an appropriate value. In this way, a predetermined pressure can be applied to the resist solution 8 in the container 42 by adjusting the pressure level, so that a desired quantity of the resist solution 8 can be discharged for a predetermined time, for example, one to five seconds.

The discharge of the resist solution 8 is terminated by closing the air operation valve 49 at the point of time when the predetermined quantity of resist solution 8 has been discharged. At the same time, the pipe 44 is then opened to the outer air by opening the air operation valve 45. Thus, the pressure in the pressure vessel 43 is reduced so that the resist solution 8 in the pipe 41 can be sucked back toward the container 42. According to such a suck-back function, the resist solution 8 remaining in the pipe can be prevented from being dropped down from the pipe after discharge of the resist solution 8 has been completed. In this event, the air operation valve 45 is held in its opened state during when the event that the liquid level in the nozzle 33 is located at the top end rather than the level of light emitted from the element 35a is detected by the element 35b, and then the air operation valve 45 is closed at the point of time when the event that the liquid level is returned rather than the level of the light is detected. Thus, the liquid level in the nozzle 33 is stopped. Fine adjustment of the liquid level in the nozzle 33 can be carried out by adjusting the regulator 51 such that a slight pressure is applied to the pressure vessel 43 under the condition that the valves 45, 49 are closed.

In this way, after the discharge of the resist solution 8 has been terminated once, the resist coating unit 25 is prepared for a succeeding resist solution discharge. Then, the resist coating is applied to predetermined sheets of wafers W by repeating the similar operations.

Like this, since the air operation valve, the suck-back valve, the pump, the filter, etc., as used in the prior art, are not inserted in the resist solution supply pipe 41, the joints are not needed. Also, since other members are not inserted in the passage, the resist solution 8 can be passed through without stagnation and also generation of the orifices and stagnation portions can be avoided in the pipes. Accordingly, fine vapors in the resist solution 8 passing through the pipe 41 and degradation of the resist solution 8 can be prevented from being generated.

In addition, since the resist solution 8 can be pressure-supplied via the pipe 41 by the gas pressure when the gas pressure is applied to the pressure vessel 43, the resist liquid can be easily supplied without the provision of the pump in the pipe. Furthermore, since a discharge on/off of the resist solution can be controlled by adjusting the gas pressure supplying system and the suck-back can be effected by switching the valve, discharge/suspension and suck-back of the resist solution 8 can be easily effected unless the air operation valve and the suck-back valve are provided in the resist solution supply pipe 41. At that time, since on/off-control of discharge of the resist solution and suck-back can be performed by operating the air operation valves, they are very simple. In addition, because the valves and the regulators are controlled by the controller 60, discharge control of the resist can be made with extremely high precision.

Figure 4:
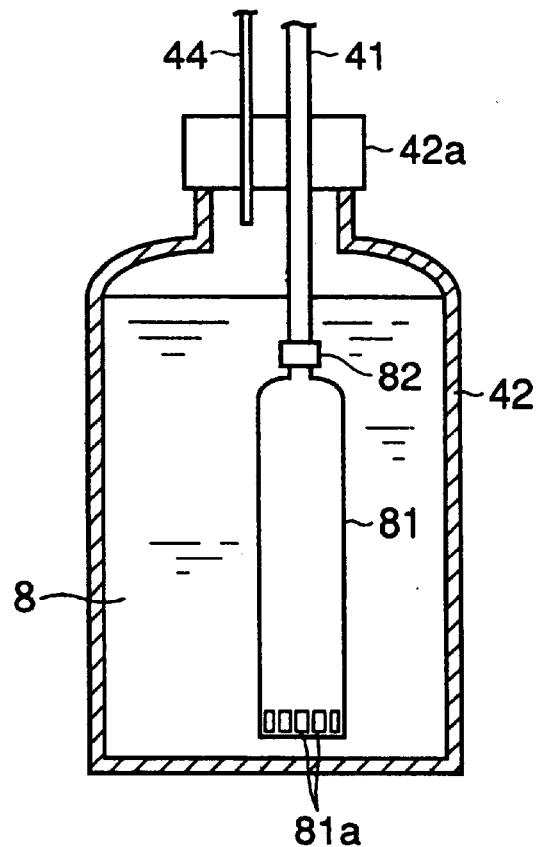
FIG. 4 is a sectional view showing a state wherein a filter is inserted into a resist solution container.

Subsequently, another embodiment of the present invention will be explained with reference to FIG. 4 hereunder. The case will be explained where the container 42 is not installed in the pressure vessel 43 but the resist is pressure-supplied by supplying the gas directly into the vessel. In such case, the resist solution 8 must be filtered by the filter and therefore, in the present embodiment, a filter 81 is placed in the container 42. As shown in FIG. 4, the filter 81 is formed like a circular cylinder and is provided in the situation that such filter 81 is immersed in the resist solution 8 stored in the container 42 with holding its axis vertically. The filter 81 is fitted to a top end of the pipe 41 inserted into the container 42 by a joint 82. A suction port 81a is formed at a lower end portion of the filter 81 and then the resist solution 8 is sucked from the suction port 81a. And, the sucked resist solution 8 is filtered by the filter 81 and then supplied to the nozzle 33 via the pipe 41.

In this manner, because the filter 81 for filtering the resist solution 8 is provided in the container 42, there is no necessity of fitting the filter in the middle of the pipe 41. Therefore, it is possible to filter the resist solution 8 without providing the joints in the pipe 41. Also, because there is needed no intervention of the air operation valve, the suck-back valve, the pump, etc. and the above filer in the resist solution supply pipe 41 unlike the prior art, these joints can be omitted and also no other member is inserted at all in the resist solution passage, so that the resist solution can be passed through without stagnation. However, the filter 81 is applicable similarly to the case where the air operation valve, the suck-back valve, the pump, etc. are inserted.

In addition, since one end of the filter 81 is fitted to a top end of the resist solution supply pipe 41 in the container 42 and also the resist solution 8 is sucked from the other end of the filter 81, the filter 81 can be fitted simply by one joint 82.

Figure 5:
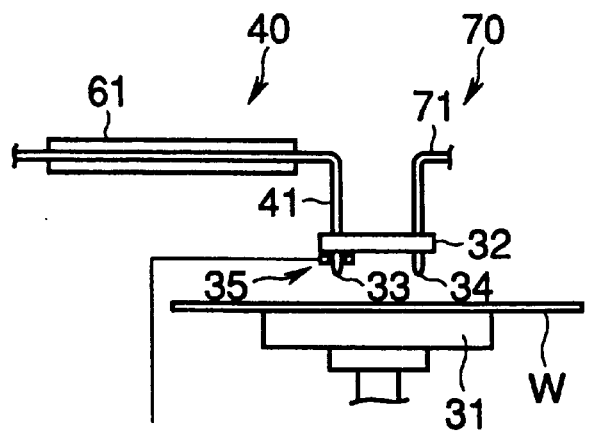
FIG. 5 is a view showing a process solution supplying apparatus in which a temperature adjusting device is provided in a piping.

Subsequently, still another embodiment of the present invention will be explained hereunder. The case will be explained where the temperature adjusting mechanism which executes a temperature adjustment of the resist solution 8 passing through the pipe 41 is employed. It is preferable that a temperature of the resist solution 8 passing through the resist liquid supply pipe 41 should be controlled. If such temperature control is executed, a temperature adjusting mechanism 61 is provided around the pipe 41, as shown in FIG. 5. In this case, from a viewpoint of the prevention of vapor and stagnation generation, it is important to provide the temperature adjusting mechanism without using the joints, etc. at the maximum.

Figure 6:
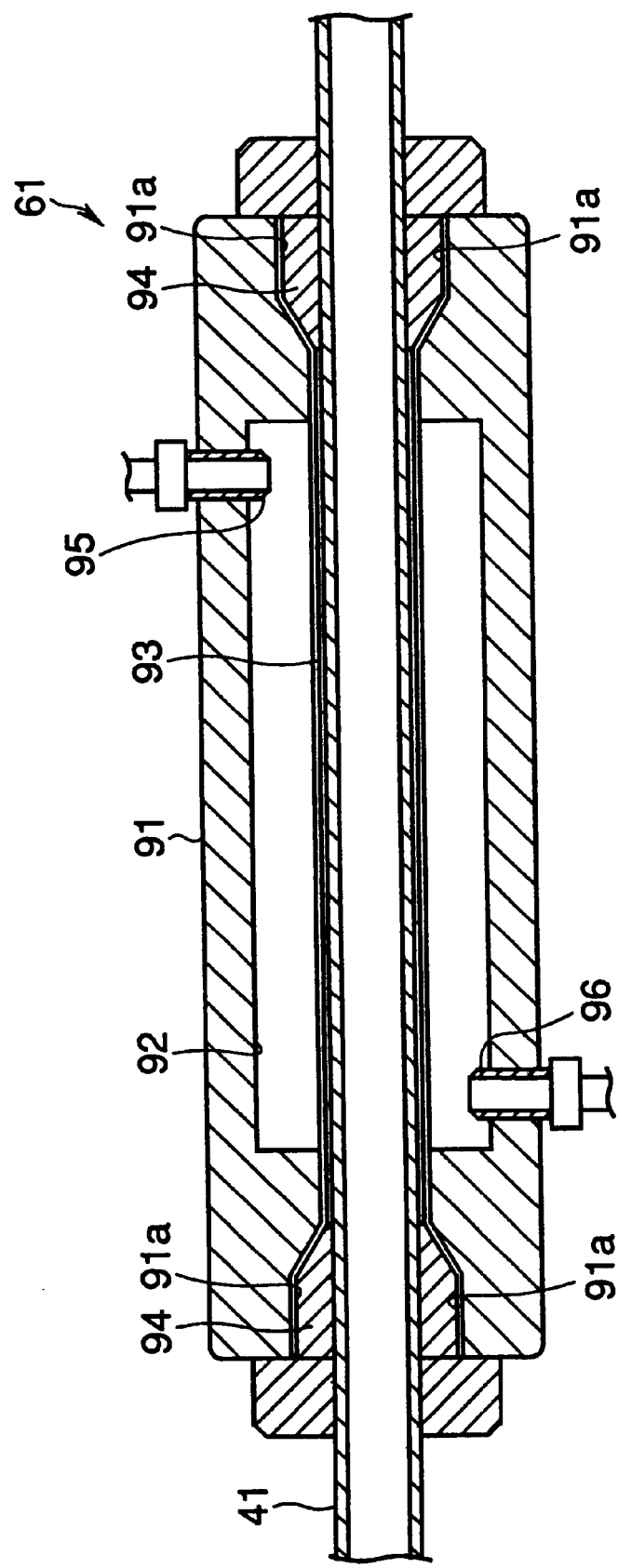
FIG. 6 is a sectional view showing a detailed configuration of the temperature adjusting device shown in FIG. 5.

In this fashion, as shown in FIG. 6, the temperature adjusting mechanism 61 has cylindrical main bodies 91 arranged around the pipe 41 at a distance, and the cylindrical main body 91 has a space, to which the temperature-controlled water (referred to as "temp-cont water" hereinafter) is supplied, in its inside. A cylindrical film member 93 is provided to cover a circumference of the portion corresponding to the main body 91 of the pipe 41. The cylindrical film member 93 has flexibility and good heat conductibility, and is fitted to both ends of the main body 61 by fitting members 94. In this case, the fitting members 94 are put into openings at both ends of the main body 91 respectively, so that the cylindrical film member 93 is pushed to an inner peripheral surface 91a at respective end portions of the main body 91. As a result, the cylindrical film member 93 is fitted to the main body 91 in a liquid sealing state not to leak out the temp-cont water to the pipe 41 side. A temp-cont water supplying member 95 and a temp-cont water exhausting member 96 are inserted into an internal space 92 from the outside of the main body 91. Pipes are connected to these members 95, 96 to circulate the temp-cont water through the internal space 92.

Since the cylindrical film member 93 must have both flexibility and good heat conductibility, preferably it should be formed by a laminated film of a metal and an elastomer. As such laminated film consisting of the metal and the elastomer, for example, there is an aluminum-polyethylene laminated film.

Figure 7:
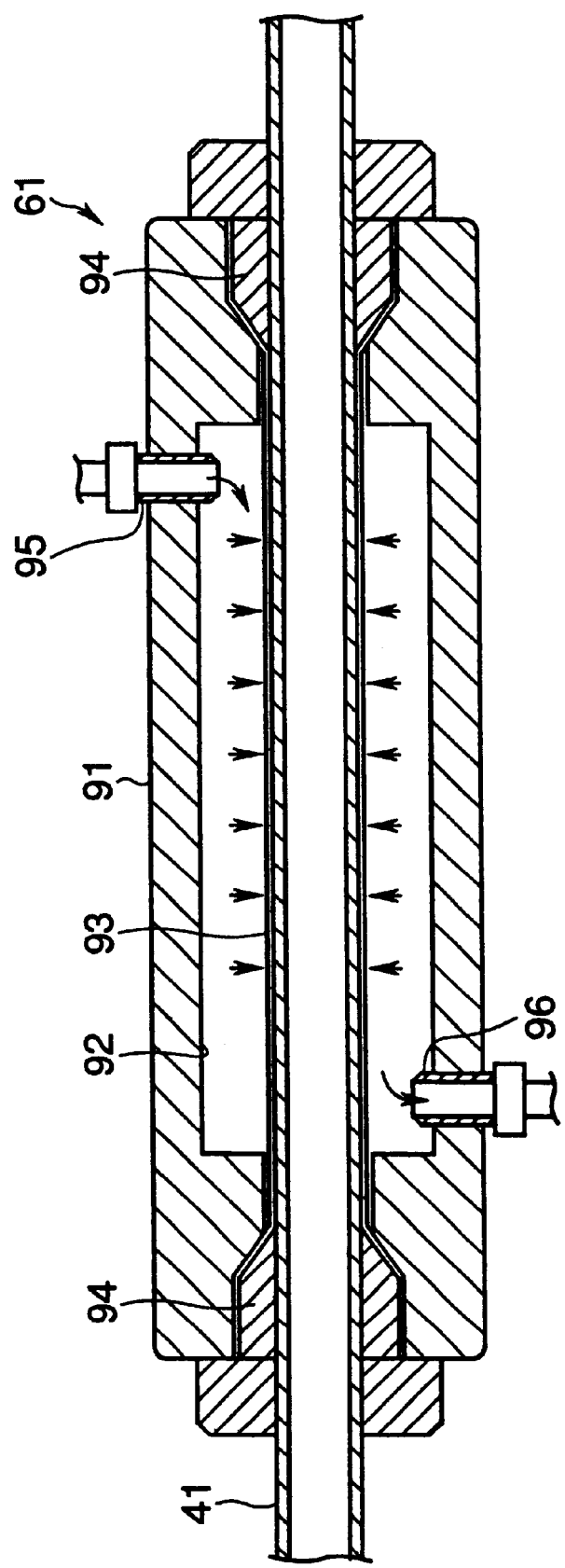
FIG. 7 is a sectional view showing an operation of the temperature adjusting device shown in FIG. 6.

In the temperature adjusting mechanism 61 constructed as above, when the temp-cont water is supplied from. the temp-cont water supplying member 95 into the internal space 92, the cylindrical film member 93 receives an internal pressure of the temp-cont water. At that time, because the cylindrical film member 93 has flexibility, as shown in FIG. 7, it can be brought into tight contact with the pipe 41 because of the internal pressure of the temp-cont water. Also, since the cylindrical film member 93 has good heat conductibility, it can effectively exchange the heat with the resist solution 8 passing through the pipe 41 when it is caused to be brought into tight contact with the pipe 41. In this event, since the cylindrical film member 93 is fitted to the main body 91 in a liquid sealing state, the temp-cont water never leaks out from the main body 91.

In this way, since temperature control of the resist solution 8 passing through the pipe 41 can be effected by supplying the temp-cont water to the main body 91 fitted to the outside of the pipe 41, then causing the cylindrical film member 93 which has flexibility and good heat conductibility to be brought into tight contact with the pipe 41, and then executing heat exchange between the resist liquid in the pipe 41 and the temp-cont water via the film member 93, the temperature of the resist solution 8 in the pipe 41 can be controlled effectively unless the heat exchanger is fitted to the pipe by two joints in the prior art. Therefore, the problem of leakage caused by the presence of the joints, the problem of degradation due to stagnation of the resist solution 8, and the problem of fine vapors due to formation of the orifices can be avoided.

In this embodiment, the pump, the air operation valve, the suck-back valve, the filter, etc. except for the temperature adjusting mechanism 61 are not provided to the pipe 41. Therefore, the resist solution 8 can be passed through with no stagnation and the above problems of leakage, liquid stagnation, and fine vapors can be eliminated substantially completely. Nevertheless, the temperature adjusting mechanism 61 may also be applied to the system into which the pump, the air operation valve, the suck-back valve, the filter, etc. are inserted.

Further, since the film member 93 can be pushed to the inner peripheral surface 91a at respective end portions of the main body 91 by putting the fitting members 94 into the openings at both ends of the main body 91 and thus can be fitted to the main body 91 in a liquid sealing state, such film member 93 can be fitted extremely simply under the condition that the leakage of the temp-cont water to the pipe 41 side can be prevented.

The present invention is not limited to the above embodiment and various modifications may be applied. Although the N2 gas has been employed as the pressure supply gas, the present invention is not limited to this and therefore any gas may be employed even if the gas has no bad effect on the resist solution. The pump may be employed as a means for supplying the gas to the pressure vessel.

In addition, although the example in which the mechanism of the present invention is used to supply the resist solution to the coating unit has been described in the above embodiment, it is needless to say that the mechanism of the present invention may be used to supply the developing solution to the developing process. Also, although the example in which the mechanism of the present invention is applied to the coating/developing unit has been shown, the present invention is not limited to this and it may be applied to other processing unit. Although the case where the semiconductor wafer is employed as the object to be processed has been explained, the present invention is not limited to this. Needless to say, the present invention may be applied to the process of other objects to be processed such as the LCD substrate, etc. Moreover, the present invention is not limited to supply of the process solution to the object to be processed, and it is applicable to overall discharge of the liquid.

Still more, the example in which the temperature adjustment mechanism is applied to the resist solution pipe has been explained, but the present invention is not limited to this. The present invention may be applied to the case where other fluid such as thinner, HMDS, etc. is transferred. In addition, though the example in which heat exchange is carried out by supplying the temp-cont water to the main body of the temperature adjustment mechanism has been shown in the above embodiment, the present invention is not limited to the water but applied to the solution if the heat exchange may be performed effectively by such solution.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A fluid supplying device comprising:

a fluid supplying source for supplying a process fluid;

a pipe for supplying the fluid from the process fluid supplying source;

a fluid supply driving system for applying a driving force to supply the process fluid from the fluid supplying source via the pipe; and a temperature adjusting mechanism provided in the pipe, for adjusting a temperature of the process fluid passing through the pipe;

wherein the temperature adjusting mechanism includes, cylindrical main bodies provided around the pipe at a distance, a film-like member having flexibility and heat conductivity, and arranged between the cylindrical main bodies and the pipe and also arranged so as to cover the pipe, fitting members for fitting the film-like member to both ends of the main body in a liquid sealing condition, and a heat exchange medium supplying means for supplying a medium into spaces between the cylindrical main bodies and the film-like member, said medium to heat exchange the process fluid in the pipe.

2. The device according to claim 1, wherein the film-like member is formed of a laminated film of a metal and an elastomer.

3. The device according to claim 1, wherein, when the fitting members are put into the opening portions at both ends of the main body, said fitting members can fit the film-like member in a liquid sealing condition such that the heat exchange medium does not leak out to the pipe.

4. A temperature adjusting device for adjusting a temperature of a process fluid passing through a pipe, comprising:

cylindrical main bodies provided around the pipe at a distance;

a film-like member having flexibility and heat conductivity, and arranged between the cylindrical main bodies and the pipe and also arranged so as to cover a circumference of the pipe;

fitting members for fitting the film-like member to both ends of the main body in a liquid sealing condition; and a heat exchange medium supplying means for supplying a medium into spaces between the cylindrical main bodies and the film-like member, said medium to heat exchange the process fluid in the pipe.

5. The device according to claim 4, wherein the film-like member is formed of a laminated film consisting of a metal and an elastomer.

6. The device according to claim 4, wherein, when the fitting members are put into the opening portions at both ends of the main body, said fitting members can fit the film-like member in a liquid sealing condition such that the heat exchange medium does not leak out to the pipe.

* * * * *

UNITED STATES PATENT AND TRADEMARK OFFICE
CERTIFICATE OF CORRECTION

PATENT NO. : 6,431,258 B1
DATED : August 13, 2002
INVENTOR(S) : Konishi

It is certified that error appears in the above-identified patent and that said Letters Patent is hereby corrected as shown below:

<u>Title page,</u>
Item [12], should read
-- [12] United States Patent
     Konishi
Item [75], Inventor, should read
-- [75] Inventor: Nobuo Konishi, Nakakoma-gun (JP) --
Item [30], Foreign Application Priority, should read
-- [30], Foreign Applcation Priority Data,
    Jul. 4, 1997     (JP) ........................9-193377 --

Signed and Sealed this

Twenty-third Day of September, 2003

JAMES E. ROGAN
*Director of the United States Patent and Trademark Office*